United States Patent [19]

Kashiwagi

[11] Patent Number: 4,633,173
[45] Date of Patent: Dec. 30, 1986

[54] APPARATUS FOR MEASURING A SIGNAL LEVEL

[75] Inventor: Toshihiro Kashiwagi, Ebina, Japan

[73] Assignee: Anritsu Electric Company Limited, Tokyo, Japan

[21] Appl. No.: 715,069

[22] Filed: Mar. 22, 1985

[51] Int. Cl.$^4$ .................... G01R 1/02; G01R 19/00; G01R 35/00

[52] U.S. Cl. .................... 324/130; 324/74; 324/77 A; 324/103 P

[58] Field of Search ............... 324/120, 130, 74, 77 A, 324/103 P

[56] References Cited

U.S. PATENT DOCUMENTS 3,486,112 12/1969 Bayer .................................... 324/74

OTHER PUBLICATIONS

Christiansen et al; "Waveform Characteristics Measuring"; *IBM Technical Disclosure Bulletin;* vol. 7, No. 4; Sep. 1964; p. 264.

*Primary Examiner*—Ernest F. Karlsen
*Assistant Examiner*—Vinh Nguyen
*Attorney, Agent, or Firm*—Frishauf, Holtz, Goodman & Woodward

[57] ABSTRACT

A measured signal is supplied to an indication section through a high-frequency amplifier, a frequency converter, and an intermediate frequency amplifier. A predetermined local oscillation signal from a local oscillator is supplied to the frequency converter. A reference signal generator generates harmonic pulses having a uniform level at a spectral interval substantially equal to or larger than the predetermined passband of the intermediate frequency amplifier, the uniform level being used to calibrate a level of the signal to be measured. A frequency setting section sets the frequency of the measured signal. A first switching section switches an input to the high-frequency amplifier to an output side of the reference signal generator in accordance with the frequency set by the frequency setting section. A control section controls an oscillation frequency of the local oscillator so as to set an indicated value at the indication section to a maximum value while an output from the reference signal generator is supplied to a high-frequency amplifier, and controls a gain of an amplifier such that the indicated value at the indication section is set to a predetermined indicated value while the local oscillator is being operated to provide the maximum value. And a second switching section switches the input to the high-frequency amplifier to an input side of the measured signal after gain control is performed by the control section.

10 Claims, 7 Drawing Figures

APPARATUS FOR MEASURING A SIGNAL LEVEL

BACKGROUND OF THE INVENTION

This invention relates to an apparatus for measuring a signal level and, more particularly, to an improvement for automatically calibrating with high precision, the gain of a measuring apparatus having frequency selectivity.

Normally, in a conventional signal level measuring apparatus such as an electric field intensity measuring apparatus having frequency selectivity, when a reception frequency changes, the gain of the RF amplifier and the conversion ratio of the frequency converter, which constitute the level measuring apparatus, vary even if the input signals have an identical level. As a result, level measurement with high precision cannot be performed.

In order to prevent the above problem, a reference signal from a reference signal source is supplied to the level measurement apparatus to perform gain calibration before measurement.

FIG. 1 shows an example of a conventional level measurement apparatus having such frequency selectivity. Reference numeral 1 denotes a measuring signal input terminal; 2, a reference signal generator for generating a calibration signal; 3, a high-frequency (RF) amplifier; 4, a frequency converter; 5, a local oscillator; 6, an intermediate frequency (IF) amplifier; 7, a filter for limiting a passband of an input signal; 8, a detector; 9, a gain controllable low-frequency amplifier; and 10, an indicator.

It should be noted that reference symbol SW denotes a switch for switching between measurement and calibration.

In the level measurement apparatus having the arrangement described above, the switch SW is set in the calibration (CAL.) side before actual measurement is performed while the apparatus is tuned to a signal frequency to be measured. A signal having the same frequency as that of the signal to be measured is generated from the generator 2 to control the gain of the apparatus. The switch SW is set in the measuring signal input terminal 1 (MEAS.) side, and the level of the signal being subjected to measurement is read at the indicator 10.

In this case, the generator 2 comprises a reference sinusoidal wave generator for generating a sinusoidal wave having the same frequency as that of the signal to be measured. However, the measuring apparatus requires complicated manual calibration and the reference signal generator has a number of expensive components. When such a generator is incorporated in the measuring apparatus, the apparatus becomes large and heavy, resulting in inconvenience.

In order to resolve the above problem, a pulse generator is used as the generator 2 to generate a plurality of harmonic waves having a uniform level.

In this method, as shown in FIG. 2A, the generator 2 is arranged so that many harmonic waves (signals) f1, f2, f3, ... having a given level and a spectral interval $\Delta f$ are simultaneously inserted in a frequency selection passband BW1 of a level measurement apparatus. The repeating frequency of the pulse generator need not be strictly set. The pulse generator can be easily incorporated in the level measurement apparatus.

However, according to this method, complicated manual calibration is required, and a plurality of harmonic signals are inserted during calibration, thereby presenting the following drawbacks which adversely affect measurement precision.

(1) When a passband BW2 of the signal to be measured is changed by the filter 7, as shown in FIG. 2B, the number of harmonic waves of the pulses falling within the passbands I and II of the filter 7 is changed, because, relation $BW2 > \Delta f$ is established since the fundamental frequency of the harmonic wave is very low. As a result, the level of the calibration signal source is changed.

(2) Since a signal of considerable magnitude having a wide harmonic wave distribution range is applied, circuits, excluding the passband limiting filter circuit, are saturated, and the input/output characteristics often cannot be linear (FIG. 2A).

SUMMARY OF THE INVENTION

It is, therefore, an object of the present invention to provide a new and improved apparatus for measuring signal levels in which the gain can be automatically calibrated with high precision.

According to the present invention, an apparatus for measuring a signal level, comprises:

a high-frequency amplification section for amplifying a signal to be measured; a local oscillator for generating a predetermined local oscillation signal; a frequency conversion section for mixing an output from the high-frequency amplification section and an output from the local oscillator to generate an intermediate frequency signal; an intermediate frequency amplification section for amplifying at a predetermined passband the intermediate frequency signal supplied from the frequency conversion section; an indication section for indicating an output from the intermediate frequency amplification section; a reference signal generator for generating harmonic pulses having a uniform level at a spectral interval substantially equal to or larger than the predetermined passband, the uniform level being used to calibrate the level of the signal to be measured; frequency setting means for setting the frequency of the signal to be measured; first switching means for switching an input to the high-frequency amplification section to an output side of the reference signal generator in accordance with the frequency set by the frequency setting means; control means for controlling an oscillation frequency of the local oscillator so as to set an indicated value at the indication section to a maximum value while an output from the reference signal generator is supplied to the high-frequency amplification section, and for controlling the gain of an amplification section such that the indicated value at the indication section is set to a predetermined indicated value while the local oscillator is being operated to provide the maximum value; and second switching means for switching the input to the high-frequency amplification section to an input side of the signal to be measured after gain control is performed by the control means.

BRIEF DESCRIPTION OF THE DRAWINGS

These and other objects and features of the present invention can be understood by reference to the accompanying drawings, in which.

DETAILED DESCRIPTION OF THE PREFERRED EMBODIMENT

An apparatus for measuring a signal level according to an embodiment of the present invention will be described with reference to the accompanying drawings.

Figure 1:
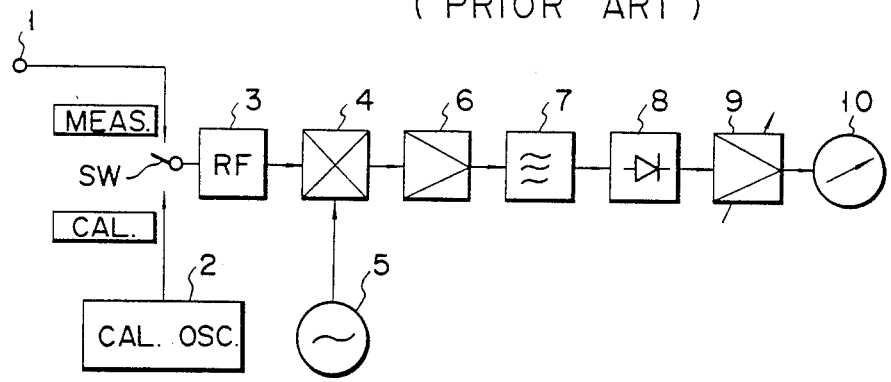
FIG. 1 is a block diagram of a conventional level measurement apparatus.
Figure 2A:
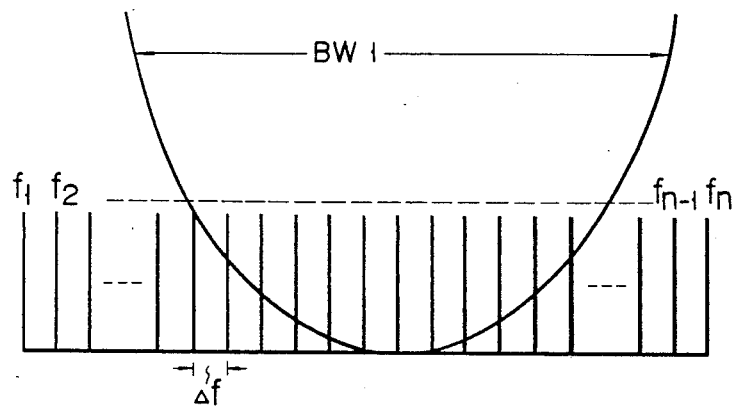
FIGS. 2A and 2B are graphs showing the relationships between the conventional harmonic calibration signal and the passband of the high-frequency amplification stage and between the conventional harmonic calibration signal and the passband of the intermediate frequency amplification stage, respectively.
Figure 2B:
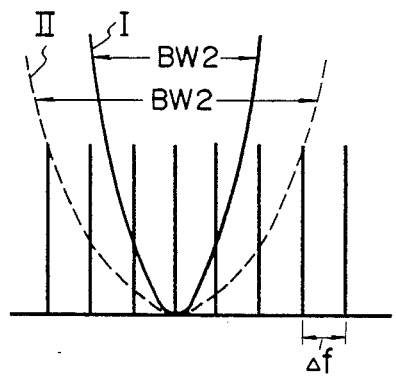
Figure 3:
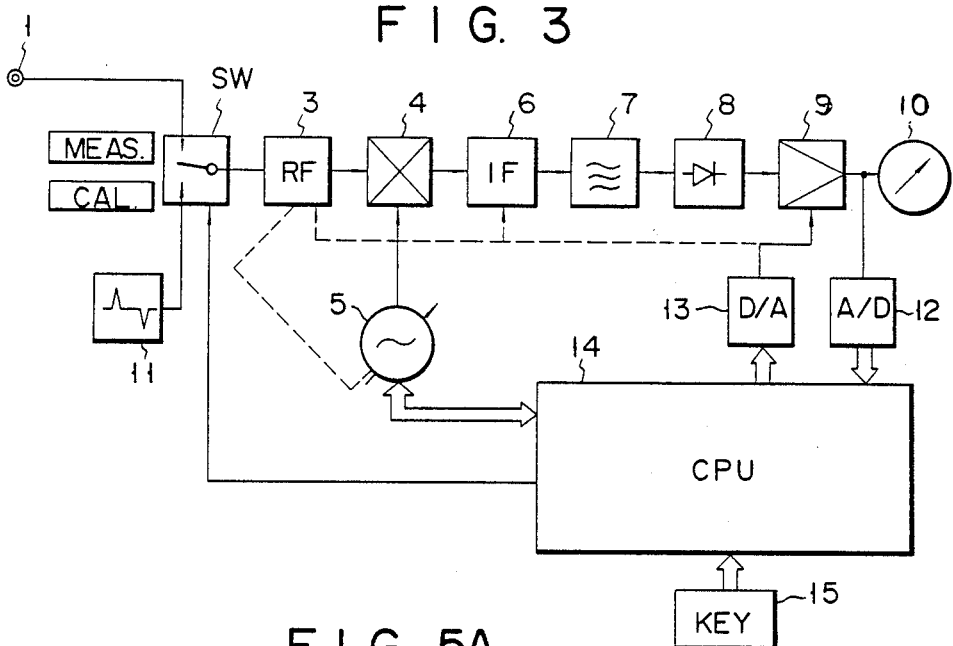
FIG. 3 is a block diagram of a level measurement apparatus according to an embodiment of the present invention.

FIG. 3 is a block diagram of the apparatus according to the embodiment of the present invention. Reference numerals 1 to 10 denote the same parts as described with reference to FIG. 1.

Referring to FIG. 3, reference numeral 11 denotes a reference pulse generator for generating a plurality of harmonic waves f11, f12, ..., and f1n having a uniform level. A spectral interval $\Delta F$ of the harmonic waves is substantially equal to or larger than a passband BW2 which is determined by the IF amplifier 6 and the filter 7. Reference numeral 12 denotes an A/D converter for converting to a digital signal an output from the amplifier 9; 13, a D/A converter for converting to an analog signal a control signal generated from a CPU (control unit) 14 and for controlling the output level of the amplifier 9; and 15, an input unit for entering data to the CPU 14. The CPU 14 performs control for shifting a frequency of the local oscillator 5 which is set to a variable frequency oscillator, during calibration control for operating the switch SW, and control of the D/A converter 13.

Figure 4:
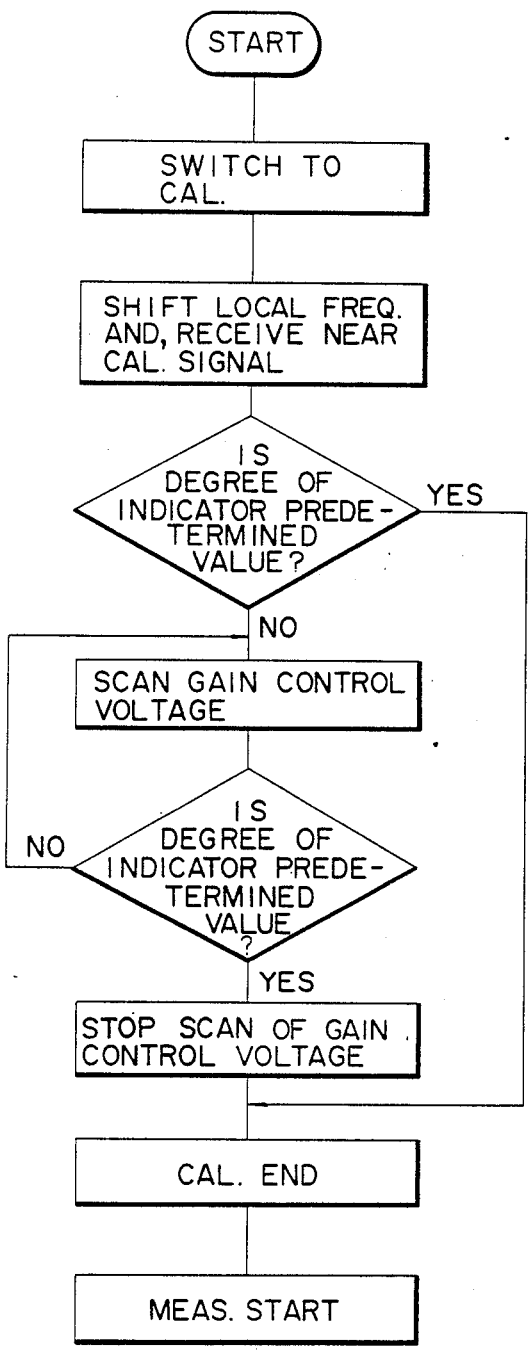
FIG. 4 is a flow chart for explaining the operation of the CPU in the apparatus shown in FIG. 3.

The operation of the level measurement apparatus according to this embodiment will be described with reference to the flow chart of FIG. 4 and the waveforms shown in FIGS. 5A and 5B.

The input unit 15 is operated to set the apparatus to a desired receiving frequency (i.e., the frequency of the signal to be measured). When the preset frequency is changed, the CPU 14 causes the switch SW to be set in the CAL. side thereof. The oscillation frequency of the local oscillator 5 is automatically controlled by the CPU 14 such that a signal among harmonic signals f11, f12, ..., and f1n from the generator 11 closest in frequency to the receiving frequency is selected.

Figure 5A:
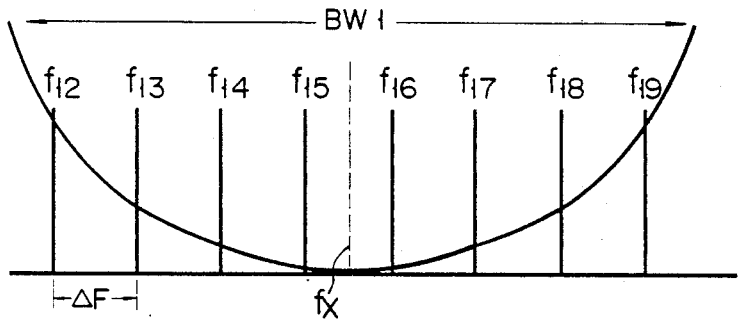
FIGS. 5A and 5B are graphs showing harmonic signals to calibrate the level measurement apparatus shown in FIG. 3.

Among the harmonic signals f11, f12, ..., and f1n generated from the generator 11, the signals f13 to f18 fall within the selected passband BW1, as shown in FIG. 5A. As shown in FIG. 5B, the frequency f15 closest to the frequency fx of the signal to be measured is selected from the harmonic signals f13 to f18 in accordance with the passband BW2 determined by the IF amplifier 6 and the filter 7 as previously described. The frequency of the harmonic wave f15 is converted to an IF frequency, as shown in FIG. 5B, and its output level is read at the indicator 10. This is because only one harmonic signal falls within the passband BW2, since relation $\Delta F > BW2$ is established.

Figure 5B:
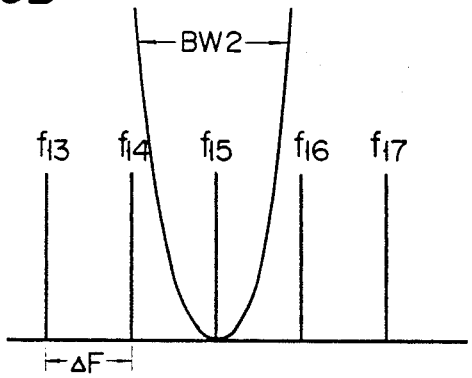

When the harmonic signal f15 is received at the center of the passband BW2 of FIG. 5B, the output level at the indicator 10 becomes the maximum.

The CPU 14 sets the local oscillation frequency so that a maximum output is obtained (i.e., one harmonic signal is located at the center of the passband BW2) by narrowly sweeping the oscillation frequency of the local oscillator 5.

The local oscillation frequency is immediately set without sweeping if the frequency of a harmonic wave of a reference pulse signal having a frequency nearest to the reception frequency is stored in the CPU 14.

In this case, the gain of the amplifier 9 is controlled through the D/A converter 13 such that the degree (scale) of the indicator 10 represents a predetermined value.

Level calibration is thus performed with reference to the output level of the generator 11.

The gain control can be performed at the RF amplifier 3, the IF amplifier 6 or at any other point.

Thereafter, the switch SW is set in the measuring signal input terminal 1 (MEAS.) side to complete automatic calibration. The signal having the frequency fx supplied to the measuring signal input terminal 1 is received, and its level is read at the indicator 10.

In this case, the passband BW1 of the amplifier 3 is normally wider than the passband BW2 determined by the amplifier 6 and the filter 7. For example, when a possible measurement range is given as 300 MHz to 1,000 MHz, the passband BW1 is set at at least several MHz. When a spectral interval of harmonic calibration signals is set to be about 200 kHz, the difference between the frequency (f15) of the harmonic calibration signal and the frequency fx of the signal to be measured falls within the range of 200 kHz, as shown in FIG. 5A. As a result, the calibration values will not substantially vary in accordance with the characteristics of the high-frequency amplification stage.

The principle of the level measurement apparatus can also be applied to a multi-superheterodyne measuring receiver.

According to the level measurement apparatus of the present invention, the pulse generator has a spectral interval wherein only one harmonic signal is received in the passband of the IF amplifier as the reference signal generator. Calibration is then performed in a state wherein only one harmonic signal is located at the center of the passband BW2 of the IF amplifier 6. Therefore, predetermined calibration is accurately performed without being influenced by the passband of the IF amplifier.

This calibration is performed under the control of the CPU 14, so that level measurement can be easily performed at high speed. In addition, the harmonic wave spectral interval of the pulse oscillator is selected to be wider than that of the conventional apparatus. Therefore, the amplitude of the pulse signal supplied to the circuit prior to the passband limiting filter of the IF amplifier can be greatly decreased to protect this circuit portion from saturation. The fundamental frequency of the harmonic signal for calibration is, for example, about 10 times that of the conventional apparatus, so that a harmonic signal having the same amplitude as that of a conventional signal can be obtained even if the amplitude of the pulse signal is decreased to, for example, about 1/10 that of the conventional apparatus.

Furthermore, since the tuning frequency of the RF amplifier can be automatically set in synchronism with the oscillation frequency of the local oscillator during calibration, precise matching need not be established in advance, unlike the conventional case.

Furthermore, gain calibratiion is automatically performed, so that the operability of the apparatus can be greatly improved and the operation panel can be made compact.

What is claimed is:

1. An apparatus for measuring a signal level comprising:
    a high-frequency amplification section for amplifying a signal to be measured;
    a local oscillator for generating a predetermined local oscillation signal;
    a frequency conversion section for mixing an output from said high-frequency amplification section and an output from said local oscillator to generate an intermediate frequency signal;
    an intermediate frequency amplification section for amplifying, at a predetermined passband, the intermediate frequency signal supplied from said frequency conversion section;
    an indication section for indicating an output from said intermediate frequency amplification section;
    a reference signal generator for generating harmonic pulses having a uniform level at a spectral interval substantially equal to or larger than the predetermined passband, the uniform level being used to calibrate a level of the signal to be measured;
    frequency setting means for setting a frequency of the signal to be measured;
    first switching means for switching an input to said high-frequency amplification section to an output side of said reference signal generator in accordance with the frequency set by said frequency setting means;
    control means for controlling a local oscillation frequency of said local oscillator so as to set the indicated value at said indication section to a maximum value while an output from said reference signal generator is supplied to said high-frequency amplification section, and for controlling a gain of an amplification section such that the indicated value at said indication section is set to a predetermined indicated value while said local oscillator is being operated to provide the maximum value; and
    second switching means for switching the input to said high-frequency amplification section to an input side of the signal to be measured after gain control is performed by said control means.

2. An apparatus according to claim 1, wherein said first and second switching means are included in said control means.

3. An apparatus according to claim 1, wherein said control means includes means for storing a frequency of the harmonic signal or the local oscillation frequency which gives the maximum value.

4. An apparatus according to claim 1, wherein said control means has a low-frequency amplification section for amplifying a detected output, which is the detected output from said intermediate frequency amplification section, as an objective of gain control.

5. An apparatus according to claim 1, wherein said control means has said high-frequency amplification section as an objective of gain control.

6. An apparatus according to claim 1, wherein said control means has the intermediate frequency amplification section as an objective of gain control.

7. An apparatus according to claim 1, wherein said control means fetches data of the local oscillation frequency which gives the maximum value from the amplification section through an analog-to-digital converter.

8. An apparatus according to claim 1, wherein said control means sends gain control data for giving the predetermined indicated value through a digital converter.

9. An apparatus according to claim 1, wherein a plurality of stages of said local oscillator, said frequency conversion section and said intermediate frequency amplification section, respectively, are included so as to constitute a multi-superheterodyne structure.

10. An apparatus according to claim 1, wherein said reference signal generator comprises a pulse generator having a spectral interval wherein only one harmonic signal falls within the passband of said intermediate frequency amplification section.

* * * * *